United States Patent [19]
Bockett-Pugh

[11] 3,940,704
[45] Feb. 24, 1976

[54] SIGNAL LIMITER CIRCUITS
[75] Inventor: Charles Paul Bockett-Pugh, Bracknell, England
[73] Assignee: Honeywell Inc., Minneapolis, Minn.
[22] Filed: Aug. 14, 1974
[21] Appl. No.: 497,239

[30] Foreign Application Priority Data
June 22, 1973 United Kingdom............ 29865/73

[52] U.S. Cl. ............... 328/169; 328/147; 307/237; 307/235 A; 307/235 N
[51] Int. Cl.² ...................................... H03K 5/08
[58] Field of Search ........... 328/147, 169, 171, 143; 307/235, 235 A, 235 N, 237

[56] References Cited
UNITED STATES PATENTS

| | | | |
|---|---|---|---|
| 3,513,353 | 5/1970 | Lansch............................ | 307/235 N |
| 3,648,071 | 3/1971 | Mrazek............................ | 328/169 X |
| 3,758,867 | 9/1973 | Schulz............................. | 328/147 X |
| 3,851,259 | 11/1974 | Porawski......................... | 328/147 X |

Primary Examiner—John S. Heyman
Attorney, Agent, or Firm—Arthur H. Swanson; Lockwood D. Burton; Mitchell J. Halista

[57] ABSTRACT

A dual limiter circuit for limiting an input signal between high and low limits and having a first and a second operational amplifier with the positive inputs of the amplifiers being supplied with respective threshold, or limit, signals. A third operational amplifier has its positive input supplied with an input signal to the limiter circuit. A respective output impedance for each amplifier connects the output of the corresponding amplifier to the output of the limiter circuit while a feedback connection from the limiter output circuit is connected to the negative inputs of all three amplifiers. This dual limiter circuit operates for all values of the input signal to have one of the amplifiers operating in its linear region to control the output signal from the limiter circuit while the other two amplifiers are operated in saturated states in opposite senses.

4 Claims, 5 Drawing Figures

SIGNAL LIMITER CIRCUITS

The present invention relates to limiter circuits.

The simplest form of limiter circuit uses a diode connected between the point to be limited and a limiting voltage, so that the diode conducts if the voltage at the point to be limited goes beyond the limiting voltage. This is, however, dependent on the diode characteristics, and circuits using operational amplifiers have been devised to overcome this.

One form of such circuit uses an operational amplifier fed with the signal to be limited on its positive input, and feeding the output via a diode. The output and the negative input of the amplifier are both connected to a limiting voltage. This circuit suffers from the disadvantage that the limiting voltage source drives the output when the signal is beyond the limiting voltage, and is therefore difficult to adjust.

Another form of such circuit uses two operational amplifiers. The first has the input signal fed to its positive input and feeds the output via a diode, the output also being fed back to its negative input. The second amplifier has the limiting voltage fed to its positive input and feeds the output via a correspondingly poled diode, and has the output fed back to its negative input. This circuit, like those described above, is effective to limit excursions of the input signal in one direction only, so that if limiting between two levels is required, i.e. a dual limiter, two circuits in series are required. With such an arrangement, the output is separated from the input by two operational amplifiers, each giving an offset.

The object of the present invention is to provide a limiting circuit which limits an input signal between two levels, while avoiding the disadvantage of the first operational amplifier circuit described above and using fewer components than two of the second operational amplifier circuits described above. The circuits of present invention also introduce only one operational amplifier offset between the input and the output.

Accordingly the present invention provides a dual limiter circuit comprising first and second operational amplifiers having their positive inputs fed with the two limiting voltages, a third operational amplifier having its input fed with the circuit input voltage, a respective impedance for each amplifier connecting its output to the circuit output, and a feedback connection from the circuit output to the negative inputs of all three amplifiers, the arrangement being such that, whatever the value of the circuit input voltage, one of the amplifiers operates in its linear region and controls the circuit output voltage while the other two amplifiers are saturated in opposite senses.

Two prior art circuits and three forms of the invention will now be described, by way of example, with reference to the accompanying drawings, in which.

Before describing the circuits, the salient characteristics of operational amplifiers will be briefly reviewed. A typical operational amplifier of the type used in these circuits has two inputs, termed the positive and the negative input respectively. For voltages V1 and V2 on these two inputs respectively, the output is $A(V1-V2)$, where A is the gain of the amplifier, and is large and positive. However, the amplifier is energized from a positive and a negative supply line, and the output voltage cannot go outside the range set by the supply voltages, and will in practice be restricted to a range slightly less than the supply voltage range. Hence unless V1–V2 is small, the output voltage will be at or near the positive or the negative supply voltage, and the amplifier will be said to be positively or negatively saturated respectively.

PRIOR ART

Figure 1:
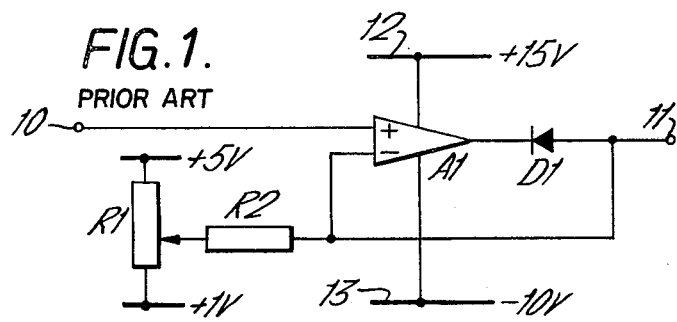
FIGS. 1 and 2 are circuit diagrams of two prior art circuits.

FIG. 1 shows a prior art circuit in which a voltage applied at input terminal 10 is limited and appears at output terminal 11. Amplifier A1 is energized from positive and negative supply lines 12 and 13 respectively. Suppose first that the input voltage is high. Amplifier A1 will be positively saturated, giving a high output. Diode D1 will be turned off, isolating the amplifier output from the output terminal 11. The output voltage will be determined by the setting of resistor R1 and the current drawn by the output through resistors R1 and R2. If the input voltage falls below the limiting voltage, amplifier A1 will desaturate and its output will fall, diode D1 will turn on, and feedback round the amplifier will occur, so holding the output voltage equal to the input voltage.

This circuit thus limits the output voltage when the input voltage exceeds a limiting voltage determined by R1 and R2. The limiting voltage is, however, dependent on the output loading, and cannot be set by monitoring the setting of R1 by a voltmeter. Further if limiting to above a second limit level is also required, a second similar circuit (with the diode reversed) must be connected in series with the circuit shown, and the signal will have to pass through two operational amplifiers, with two voltage offsets.

Figure 2:
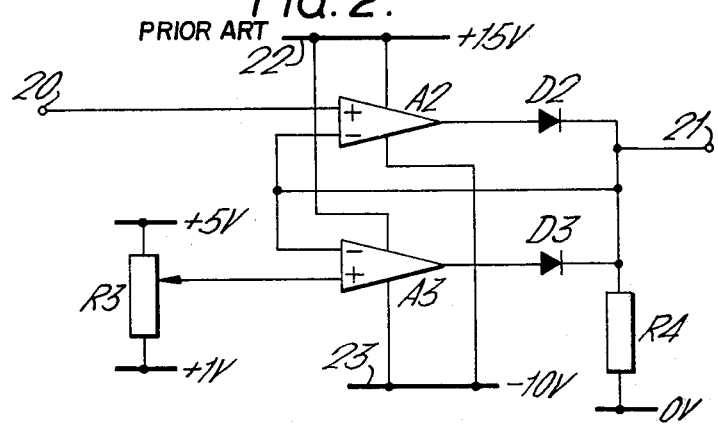

FIG. 2 shows another prior art limiting circuit, of generally symmetrical form, the input voltage being applied to the positive input of amplifier A2 and the limiting voltage to the positive input of amplifier A3, and the amplifier being energized from supply lines 22 and 23. Diodes D2 and D3 together form a maximum signal selector, so that the output voltage at terminal 21 is the greater of the voltages at the outputs of the two amplifiers A2 and A3. This output is fed back to the negative inputs of the two amplifiers. If the input voltage is greater than the limiting voltage set by resistor R3, then amplifier A2 will have substantially equal inputs and will produce the output voltage, amplifier A3 being negatively saturated to produce a negative output which is isolated from the output by diode D3. Similarly, if the input voltage is below the limiting voltage, amplifier A3 produces the output voltage and amplifier A2 is negatively saturated and isolated.

This circuit thus limits the output voltage when the input voltage falls below a limiting voltage determined by R3. The limiting voltage is not affected by the output, and can be set by monitoring the tapping point on R3 by a voltmeter. However, if limiting to below a second limit level is also required, this circuit must be followed by another similar one (with the diodes reversed), and the signal will have to pass through two operational amplifiers, with two voltage offsets. Also, the amount of circuitry becomes rather large.

FIRST EMBODIMENT OF INVENTION

Figure 3:
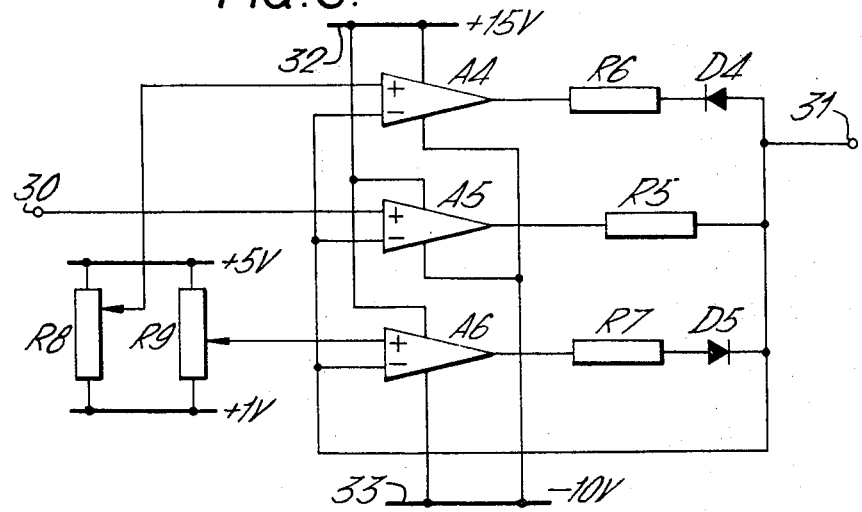
FIGS. 3 to 5 are circuit diagrams of the three respective forms of the invention.

FIG. 3 shows a dual limiter circuit comprising three amplifiers A4 to A6 energized from supply lines 32 and 33, and positive inputs fed with a high limit voltage (defined by the setting of R8), the input signal (from terminal 30), and a low limit voltage (defined by the setting of R9) respectively. The amplifiers are connected to the output terminal 31 via two diodes D4 and D5 and three resistors R5 to R7 as shown, and the output terminal is connected back to the negative inputs of all three amplifiers. Resistor R5 is large, e.g. 15 KΩ, compared to resistors R6 and R7, which may be 1 KΩ each.

For convenience, it will be assumed that the two limiting voltages are +5 V and +1 V. Three separate conditions need to be considered, depending on whether the input voltage is above the high limit, between the limits, or below the low limit. Input voltages of +6 V, +3 V, and 0 V may conveniently be taken for these three conditions.

Consider first an input voltage of +6 V. This is above the high limit voltage, and the output voltage will be limited to +5 V. Amplifier A5 will be saturated positively and amplifier A6 saturated negatively, while amplifier A4 is operating in its linear region. The output of amplifier A6 will be isolated by the forward poled diode D5, and will not affect the operation. Amplifier A5 will produce a forward current through resistor R5, which will flow round through diode D4 into amplifier A4. The output of amplifier A4 will be +5 V (neglecting resistor R6 for the moment), holding the output terminal 31 at this voltage.

The large forward gain of A4 is sufficient to give a +5 V output for a very small difference between the output voltage and the high limit voltage at its input. The inclusion of R6 (which, like R7, is small compared with R5) results in a voltage drop so that the output voltage of A4 is in fact below the output voltage. The feedback loop and the high gain of A4 ensure that this voltage drop, and any drop across the diode D4, do not significantly affect the output voltage.

Consider next an input voltage of +3 V. The output voltage will also be +3 V, resulting in amplifier A5 operating in its linear region to maintain the output voltage at this value, while amplifiers A4 and A6 will be saturated positively and negatively respectively, both being cut off from the output by the diodes D4 and D5.

Considering finally an input voltage of 0 V, the effects of this correspond broadly to the effects of an input voltage of +6 V, by virtue of the symmetry of the circuit. Amplifiers A4 and A5 are saturated positively and negatively respectively, and amplifier A6 is operating in its linear region to hold the output at +1 V.

The resistors R6 and R7 are included merely as a safety measure in case the resistors R8 and R9 should be set to give a high limit below the low limit. Amplifiers A4 and A6 would then be saturated negatively and positively respectively, and resistors R6 and R7 prevent excessive current flow from A6 to A4 under those conditions.

It is obvious that the limit setting resistors R8 and R9 are not loaded by the load on the output terminal, and can therefore be set by the aid of a voltmeter. Further, there is only one operational amplifier offset between the input and the output when the input signal is between the two limit levels. Finally, the circuit achieves dual limiting with only three operational amplifiers.

SECOND EMBODIMENT

Figure 4:
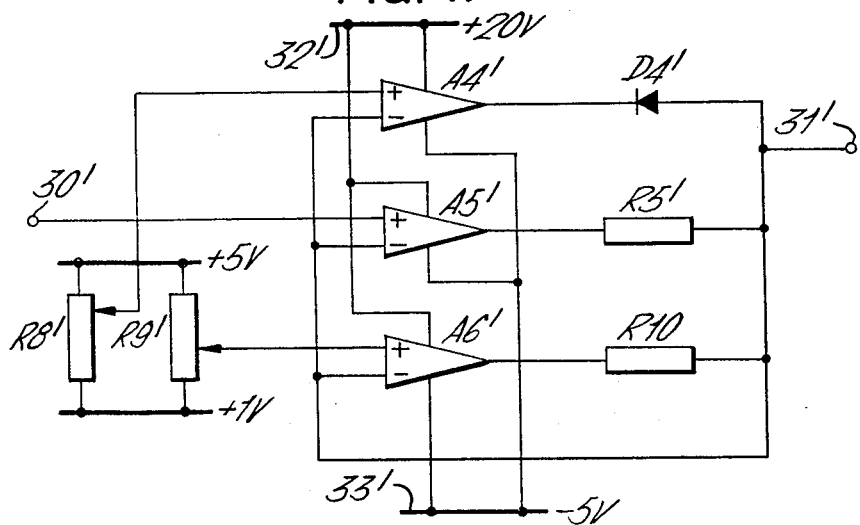

This circuit, shown in FIG. 4 resembles the FIG. 3 circuit and corresponding elements have similar references but are distinguished by primes.

The FIG. 4 circuit can be obtained from the FIG. 3 circuit by omitting diode D5 and resistor R6, and replacing resistor R7 by a resistor R10 equal to resistor R5. Thus amplifier A4' feeds the output through diode D4' and amplifiers A5' and A6' through equal resistors R5' and R10. In addition, the power supply to the operational amplifiers is asymmetric as shown, at +20V and −5V, so that the mean value of the two saturation levels of the amplifiers, +7.5V, is above the high limit voltage (5V or less).

The operation of this embodiment is broadly similar to that of the FIG. 3 circuit, insofar as corresponding amplifiers are saturated for the various conditions.

However, when the input signal is +6 V, the negatively saturated output of amplifier A6' is not isolated by a diode. The output of amplifier A5' is positively saturated, and its output current flows through resistor R5' and then divides, part flowing through diode D4' into amplifier A4' and part flowing through resistor R10 into amplifier A6'. Because the resistors R5 and R10 are equal, the voltage at their junction will tend to be the mean of the two saturation levels; as this is above the high limit voltage, diode D4' and amplifier A4' will pull the output voltage down to the high limit voltage.

For an input voltage of +3 V, amplifier A5' will be in the linear region. However, its output voltage will be higher than in the FIG. 3 circuit, because it will have to supply current to the negatively saturated amplifier A6' via resistors R5' and R10 as well as the output current.

For an input 0 V, amplifier A5' will be saturated negatively and the output of amplifier A6' will have to supply current to it, and because of resistor R10, its output voltage will be higher than in the first form of the circuit. The asymmetry of the power supply ensures that this can be properly achieved.

Resistors R5' and R10 could be unequal, but this would result in a greater asymmetry of the power supply being required.

It is obvious that an exactly equivalent circuit can be derived from the FIG. 3 circuit by omitting diode D4 and resistor R7, and replacing resistor R6 by a resistor equal to resistor R5.

THIRD EMBODIMENT

Figure 5:
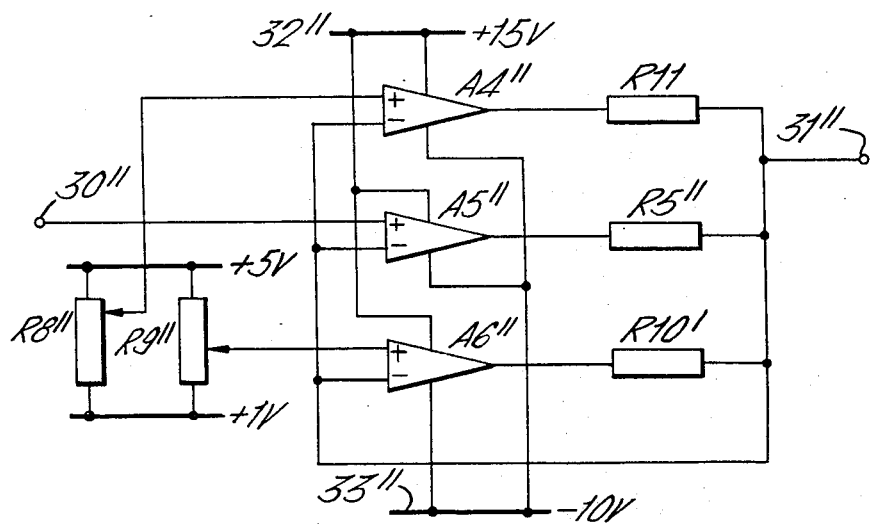

This circuit, shown in FIG. 5, resembles the FIGS. 3 and 4 circuits, and corresponding elements have corresponding references distinguished by an additional prime. The FIG. 5 circuit can be derived from the FIG. 4 circuit by omitting diode D4' and replacing it by a resistor R11 equal to resistors R5" and R10'. In addition, the power supply voltages must be such that the spans between the high limit voltage and the positive saturation level, and between the low limit voltage and the negative saturation level, are both greater than the span between the high and low limit voltages; the voltages are therefore +15 V on line 32" and −10 V on line 33" as shown.

The operation of this form of the circuit is the same as for the other two forms insofar as the saturation of the amplifiers is concerned. Considering however the effects of two amplifiers being saturated, one positively and one negatively, the current flowing between them will tend to bring the output voltage to the mean of the two saturation levels. The third amplifier will be operating in its linear region, i.e. producing an output between the two saturation levels, and can therefore move the output voltage to anywhere within the middle third of the span between the two saturation levels.

Inequality of the resistors R5", R10', and R11 will reduce the permissible range between the saturation levels for the high and low limits.

The embodiments of the invention in which an exclusive property or privilege is claimed are defined as follows:

1. A dual limiter circuit comprising first and second operational amplifiers having their positive inputs fed with the two limiting voltages, a third operational amplifier having its positive input fed with the limiter circuit input voltage, a respective impedance for each amplifier connecting its amplifier output to the limiter circuit output, and a feedback connection from the limiter circuit output to the negative inputs of all three amplifiers, the arrangement being such that, whatever the value of the circuit input voltage, one of the amplifiers operates in its linear region and controls the circuit output voltage while the other two amplifiers are saturated in opposite senses.

2. A dual limiter circuit according to claim 1 where the impedance for the third amplifier is resistive and the impedances for the first and second amplifiers include oppositely poled diodes.

3. A dual limiter circuit according to claim 1 where the impedances for the first and third amplifiers are resistive and the impedance for the second amplifier includes a diode.

4. A dual limiter circuit according to claim 1 where the impedances for all three amplifiers are all resistive.

* * * * *